(12) United States Patent  
Liu et al.

(10) Patent No.: US 9,582,356 B1  
(45) Date of Patent: Feb. 28, 2017

(54) SYSTEM AND METHOD FOR DDR MEMORY TIMING ACQUISITION AND TRACKING

(71) Applicant: MARVELL INTERNATIONAL LTD., Hamilton (BM)

(72) Inventors: Peter Tze-Hwa Liu, Alameda, CA (US); Saswat Mishra, Santa Clara, CA (US)

(73) Assignee: MARVELL INTERNATIONAL LTD. (BM)

( * ) Notice: Subject to any disclaimer, the term of this patent is extended or adjusted under 35 U.S.C. 154(b) by 130 days.

(21) Appl. No.: 14/522,695

(22) Filed: Oct. 24, 2014

Related U.S. Application Data (60) Provisional application No. 61/898,856, filed on Nov. 1, 2013.

(51) Int. Cl.
| | | |
|---|---|---|
| *G11C 29/00* | (2006.01) | |
| *G06F 11/10* | (2006.01) | |
| *G06F 11/16* | (2006.01) | |
| *G06F 11/30* | (2006.01) | |
| *G06F 11/34* | (2006.01) | |

(52) U.S. Cl.  
CPC ...... *G06F 11/1048* (2013.01); *G06F 11/1604* (2013.01); *G06F 11/3037* (2013.01); *G06F 11/348* (2013.01)

(58) Field of Classification Search  
CPC ............. G11C 11/4076; G06F 12/0246; G06F 13/4081; G06F 1/3296; G06F 3/0604  
See application file for complete search history.

(56) References Cited

U.S. PATENT DOCUMENTS

| | | | | |
|---|---|---|---|---|
| 3,566,380 | A * | 2/1971 | Shafer ................. | G11C 19/085 365/171 |
| 2003/0092464 | A1* | 5/2003 | Li ......................... | H04L 1/0009 455/78 |
| 2003/0212830 | A1* | 11/2003 | Greenblat ............. | G06F 15/78 709/251 |
| 2004/0022106 | A1* | 2/2004 | Heyne .................. | G11C 7/1015 365/202 |
| 2006/0020449 | A1* | 1/2006 | Wong ................... | G10L 19/012 704/215 |
| 2006/0208066 | A1* | 9/2006 | Finn ..................... | G06K 7/0004 235/380 |
| 2008/0248774 | A1* | 10/2008 | So ........................ | H04B 1/525 455/296 |
| 2010/0317374 | A1* | 12/2010 | Alpert .................. | H04W 68/02 455/458 |

* cited by examiner

*Primary Examiner* — Guy Lamarre (57) ABSTRACT

Systems, methods, and other embodiments associated with providing real time closed loop control of memory access are described. According to one embodiment, a method includes accessing a memory of a computing device during real time operation of the computing device and detecting bit errors associated with the accessing of the memory. The method also includes generating a performance metric based on, at least in part, the detected bit errors during the real time operation of the computing device. The method further includes adjusting a setting of at least one timing element, of a plurality of timing elements of a physical layer of the computing device, based on the performance metric during the real time operation of the computing device to maintain a determined memory access performance.

20 Claims, 9 Drawing Sheets

SYSTEM AND METHOD FOR DDR MEMORY TIMING ACQUISITION AND TRACKING

CROSS REFERENCE TO RELATED APPLICATIONS

This patent disclosure claims the benefit of U.S. Provisional Application Ser. No. 61/898,856 filed on Nov. 1, 2013, which is hereby wholly incorporated by reference.

BACKGROUND

The background description provided herein is for the purpose of generally presenting the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

The speed at which memory is accessed by, for example, system-on-chip (SOC) devices (e.g. in server computers or mobile telephones) has rapidly increased in recent years. In particular, double-data-rate (DDR) memory is a type of very fast computer memory that uses clock signals in a manner that allows twice the data to be transferred in the same amount of time. As the speed of the various signals involved in accessing the DDR memory has increased, the timing associated with such signals has become more sensitive and, thus, more prone to degradation. For example, subtle changes in environmental parameters including power, voltage, and temperature can greatly affect the timing of the memory accessing signals at high-speeds. Signal degradation can lead to data corruption within the memory.

Today, the timing associated with DDR memory access is typically initialized when the SOC is first powered up. During operation, if data associated with the memory becomes corrupted over time, the process of writing data to and reading data from the memory (i.e., the memory access process) has to be stopped and the memory has to be flushed to eliminate the corrupted data. The timing associated with the memory access process has to be re-initialized before resuming normal operation. Such interruptions in normal operation are inefficient and result in the reduction of SOC bandwidth and performance.

SUMMARY

In general, in one aspect this specification discloses an apparatus. In one embodiment, the apparatus includes a memory configured to be accessed by having data written thereto and read therefrom (i.e., configured for memory access). The apparatus also includes memory control logic configured to facilitate memory access of the memory via a plurality of signal lines. The apparatus further includes physical layer logic configured to provide a tunable signal interface for the plurality of signal lines between the memory control logic and the memory. The apparatus also includes performance monitor logic configured to provide closed loop control to maintain a determined apparatus performance associated with the memory access. In one embodiment, the closed loop control involves detecting bit errors associated with the memory access during real time operation of the apparatus; generating a performance metric based on, at least in part, the detected bit errors during the real time operation of the apparatus; and tuning a signal parameter of at least one signal associated with at least one signal line of the plurality of signal lines via the physical layer logic based on, at least in part, the performance metric during the real time operation of the apparatus.

In general, in another aspect, this specification discloses a computer-implemented method. In one embodiment, the method includes accessing a memory of a computing device during real time operation of the computing device and detecting bit errors associated with the accessing of the memory. The method also includes generating a performance metric based on, at least in part, the detected bit errors during the real time operation of the computing device. The method further includes adjusting a setting of at least one timing element, of a plurality of timing elements of a physical layer of the computing device, based on the performance metric during the real time operation of the computing device to maintain a determined memory access performance.

In general, in another aspect, this specification discloses an integrated circuit device. In one embodiment, the integrated circuit device includes a central processing logic, a direct memory access logic operably connected to the central processing logic, and a double data rate memory. The integrated circuit device also includes memory control logic operably connected to the central processing logic and the direct memory access logic. The memory control logic is configured to provide continuous real time closed loop control to maintain a determined memory access performance of the double data rate memory during real time operation of the integrated circuit device.

BRIEF DESCRIPTION OF THE DRAWINGS

The accompanying drawings, which are incorporated in and constitute a part of the specification, illustrate various systems, methods, and other embodiments of the disclosure. Illustrated element boundaries (e.g., boxes, groups of boxes, or other shapes) in the figures represent one example of the boundaries. In some examples one element may be designed as multiple elements or multiple elements may be designed as one element. In some examples, an element shown as an internal component of another element may be implemented as an external component and vice versa.

DETAILED DESCRIPTION

Described herein are examples of systems, methods, and other embodiments associated with providing real time closed loop control of high-speed memory access performance. Data written to or read from, for example, DDR memory in a system-on-chip (SOC) device can become corrupted when the timing of high-speed (high-frequency) signals associated with accessing the DDR memory becomes degraded. The timing of such high-speed signals is susceptible to degradation as environmental parameters of the SOC device drift. Such environmental parameters may include, for example, power, voltage, and temperature.

In one embodiment, memory control logic monitors a performance metric associated with high-speed memory access and tunes the timing of the high-speed signals during real time operation of the SOC device to maintain a determined memory access performance. The terms "determined memory access performance", "determined system performance", and "determined apparatus performance" are used interchangeably herein.

Figure 1:
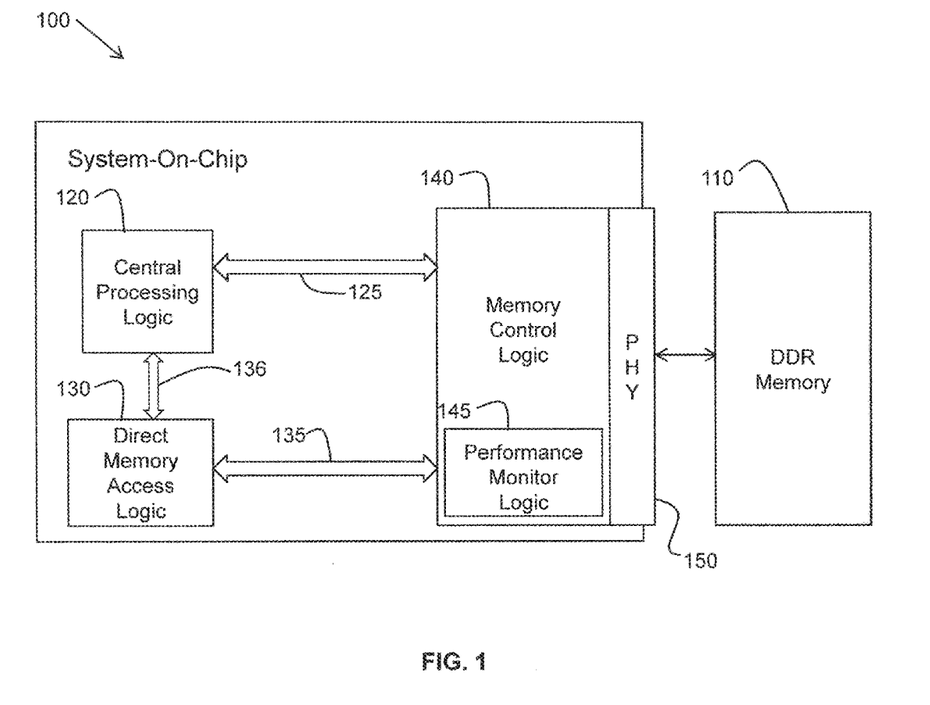
FIG. 1 illustrates one embodiment of a system or apparatus associated with accessing double data rate (DDR) memory.

FIG. 1 illustrates one embodiment of a system or apparatus 100 associated with accessing double data rate (DDR) memory 110. As used herein, the terms "accessing memory" or "memory access" refer to the process of writing data to and/or reading data from memory. The system 100 includes central processing logic 120, direct memory access logic 130, and memory control logic 140. The system 100 also includes performance monitor logic 145, physical layer logic (PHY) 150, and the DDR memory 110.

In one embodiment, the system 100 is implemented on a chip (i.e., a system-on-chip or SOC configuration) including one or more integrated circuits configured to perform one or more of the functions described herein. In the embodiment of FIG. 1, the performance monitor logic 145 is part of the memory control logic 140. However, in accordance with another embodiment, the performance monitor logic 145 may be implemented separately from the memory control logic 140. In another embodiment, the logics of the system 100 may be part of an executable algorithm configured to perform the functions of the logics where the algorithm is stored in a non-transitory medium. In still another embodiment, the system 100 is implemented on a chip except for the DDR memory 110 which is implemented on another chip.

Referring to FIG. 1, the central processing logic 120 is operably connected to the memory control logic 140 via a communication bus 125. The central processing logic 120 is configured to provide commands to the memory control logic 140 via the communication bus 125 to, for example, program the memory control logic 140 and tell the memory control logic 140 and other devices where data is stored in the DDR memory 110. In one embodiment, the communication bus 125 is an advanced peripheral bus (APB). The direct memory access (DMA) logic 130 is operably connected to the memory control logic 140 via a communication bus 135 and to the central processing logic 120 via a communication bus 136. The DMA logic 130 is configured to access the DDR memory 110 via the communication bus 135. For example, both commands and data may be communicated between the DMA logic 130 and the memory control logic 140 via the communication bus 135 for the purpose of accessing the DDR memory 110.

The DDR memory 110 is configured to have data written to the DDR memory 110 and read from the DDR memory 110 under the command of the memory control logic 140. DDR memory 110 is a type of very fast computer memory that uses clock signals in a manner that allows twice the data to be transferred in the same amount of time. For example, in one embodiment, the DDR memory 110 is a double data rate synchronous dynamic random access memory (DDR SRAM). In this manner, efficient memory access may be achieved.

Figure 2:
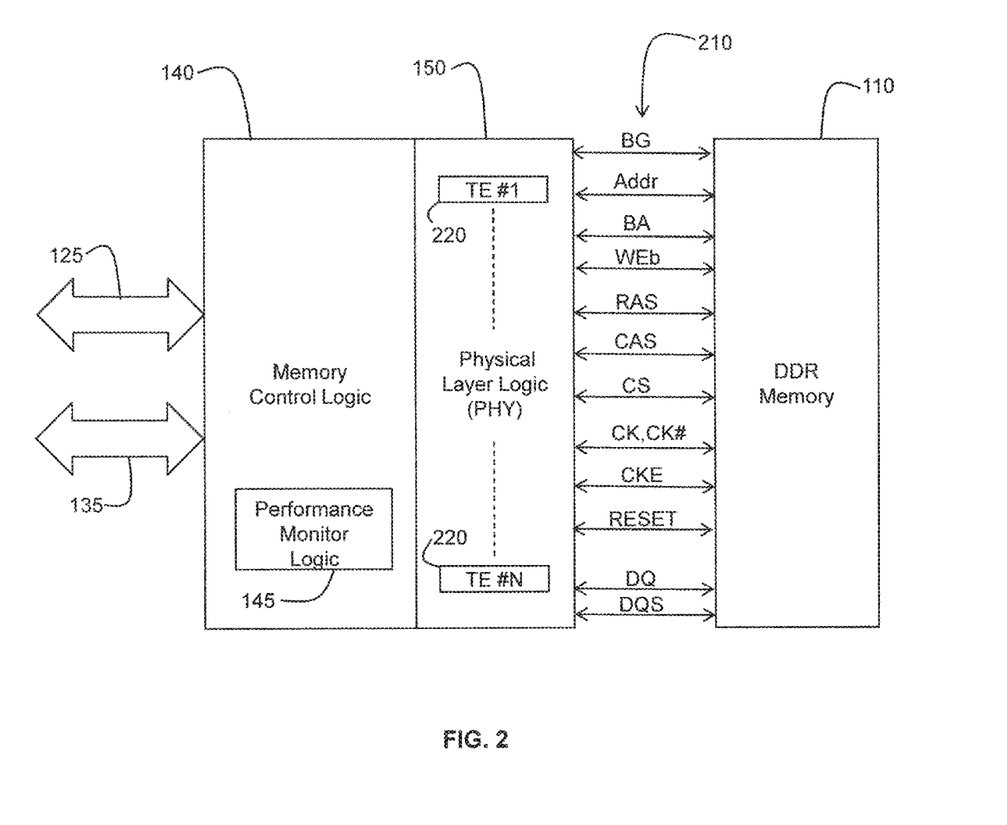
FIG. 2 illustrates a portion of the embodiment of FIG. 1, showing one example embodiment of high-speed signals configured to facilitate high-speed memory access of the DDR memory.

FIG. 2 illustrates a portion of the embodiment of FIG. 1, showing one example embodiment of the high-speed signal lines (or traces) and associated signals 210 configured to facilitate high-speed memory access of the DDR memory 110. In one embodiment, the term "high-speed" refers to greater than or equal to 800 MHz. The physical layer logic (PHY) 150 is configured to provide a tunable signal interface for the high-speed signal lines and associated signals 210 between the memory control logic 140 and the DDR memory 110. In one embodiment, the signals of the high-speed signal lines and associated signals 210 are analog signals that are under the control of the performance monitor logic 145 of the memory control logic 140. One or more of the signals may be greater than or equal to 800 MHz, in accordance with one embodiment. One or more of the signals may be greater than or equal to 1600 MHZ, in accordance with another embodiment. The high-speed signal lines and associated signals 210 facilitate the high-speed accessing of the DDR memory 110 and are discussed in more detail below herein.

The performance monitor logic 145 is configured to provide closed loop control within the system 100 to maintain a determined system performance associated with the high-speed memory access (i.e., memory access performance). In one embodiment, the performance monitor logic 145 detects bit errors associated with high-speed access of the DDR memory 110 during real time operation of the system 100. In one embodiment, detection of the bit errors is accomplished by error control coding (ECC) techniques. Such ECC techniques may be implemented as ECC logic which is part of the performance monitor logic 145. Also, during real time operation of the system 100, the performance monitor logic 145 generates a performance metric based on the detected bit errors. In one embodiment, the performance metric is an instantaneous bit error rate (BER).

Furthermore, during real time operation of the system 100, the performance monitor logic 145 tunes a signal parameter of at least one signal of the high-speed signal lines and associated signals 210 within the PHY 150 to maintain the determined system performance. In one embodiment, the signal parameter is a time delay or a timing window position, and the determined system performance (i.e., the memory access performance) is a determined bit error rate (BER). The PHY 150 includes timing elements (TEs) 220, associated with the high-speed signal lines and associated signals 210, which can be tuned or adjusted to affect the time delay or timing window position of each signal of the high-speed signal lines and associated signals 210. In one embodiment, the timing elements (TEs) 220 include tapped delay lines and registers and the adjustment resolution is 20 pico-seconds.

Again, the high-speed signal lines and associated signals 210 are configured to facilitate high-speed DDR memory access (i.e., the writing/reading of data to/from the DDR memory 110). The high-speed signal lines and associated signals 210 may include clock signal lines, address signal lines, command signal lines, and control signal lines. In accordance with one embodiment, referring to FIG. 2, the high-speed address signal lines include a bank group (BG) signal line, an address (Addr) signal line, and a bank (BA) signal line. The high-speed command signals lines include a write enable (WEb) signal line, a row access strobe (RAS) signal line, and a column access strobe (CAS) signal line. The high-speed control signal lines include a chip select (CS) signal line, a clock enable (CKE) signal line, and a RESET signal line. The high-speed clock signal lines include clock signal lines (CK, CK#). Each of these high-speed signal lines and associated signals 210 may be tuned by the performance monitor logic 145 via the PHY 150 during real time operation of the system as data is being written to or read from the DDR memory 110.

Also shown in FIG. 2 is a data path (DQ) and associated data strobe signal line and associated signal (DQS). The data path (DQ) is the path that the actual data takes when being written to or read from the DDR memory 110. The data strobe (DQS) signal line and associated signal facilitates transfer of the actual data along with the other high-speed signal lines and associated signals 210 discussed above herein. In one embodiment, the data strobe (DQS) signal line and associated signal is also tuned by the performance monitor logic 145 via the PHY 150, but the data path (DQ) is not tuned. In this manner, the high-speed signal lines and associated signals 210 provide the speed to facilitate high-speed memory access.

Figure 3:
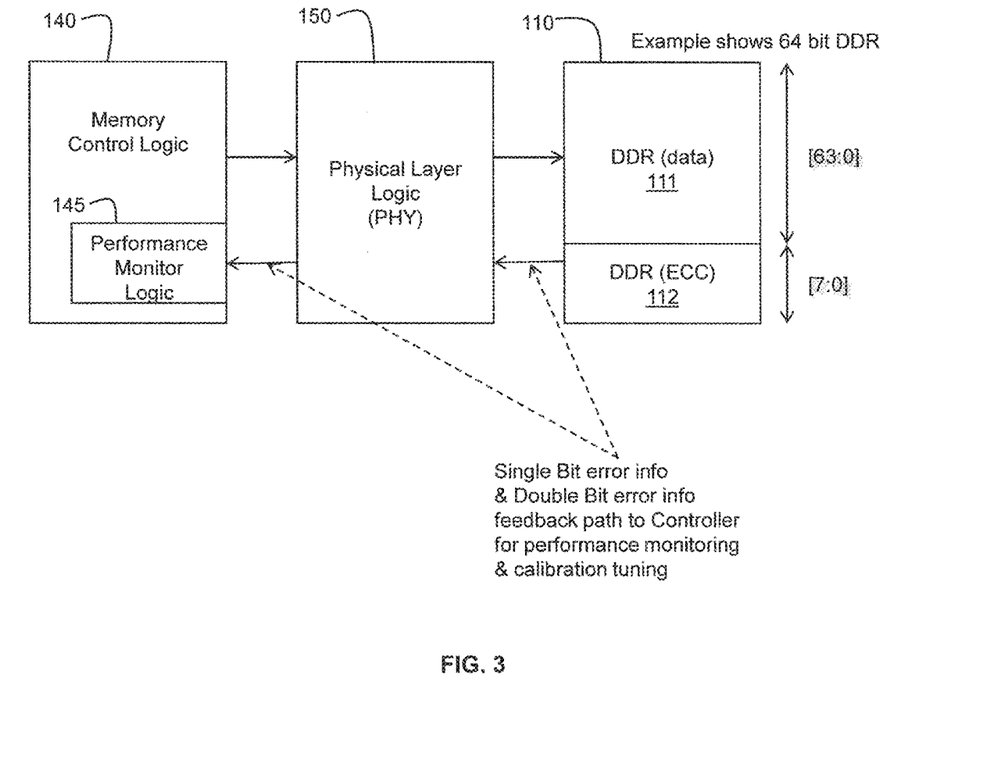
FIG. 3 illustrates a portion of the system of FIG. 1, showing one example embodiment of how the DDR memory may be segmented between a data portion and an error control coding (ECC) portion.

FIG. 3 illustrates a portion of the system 100 of FIG. 1, showing one example embodiment of how the DDR memory 110 may be segmented between a data portion 111 and an error control coding (ECC) portion 112. ECC techniques are performed by the performance monitor logic 145 to detect bit errors during real time operation of the system 100 as data is being written to and read from the DDR memory 110 (i.e., bit errors associated with DDR memory access). A portion of the DDR memory 110 is configured to facilitate error control coding (ECC) techniques performed by the performance monitor logic 145.

Referring to FIG. 3, as part of the ECC techniques, every 64 bits of data in the DDR memory 110 is associated with 8 bits of ECC information (bit error information), in accordance with one embodiment. As a result, the ECC techniques impart an overhead of about 11% on the DDR memory 110. During real time operation of the system 100, the bit error information is fed back to the performance monitor logic 145 through the PHY 150. The 8-bits of EEC information (bit error information) are used by the performance monitor logic 145 to detect bit errors. The EEC techniques may also correct at least some of the detected bit errors within the DDR memory 110. For example, detected single bit errors may be corrected but detected double bit errors may not be corrected, in accordance with one embodiment.

In one embodiment, the performance monitor logic 145 determines an instantaneous bit error rate (BER) (i.e., a performance metric) based on the detected bit errors. The instantaneous BER is used by the performance monitor logic 145 to tune one or more of the high-speed signal lines and associated signals 210 via the PHY 150 to maintain a determined system or memory access performance without disturbing normal data traffic. The determined system or memory access performance may be a determined bit error rate (e.g., $10^{-9}$), in accordance with one embodiment.

Figure 4:
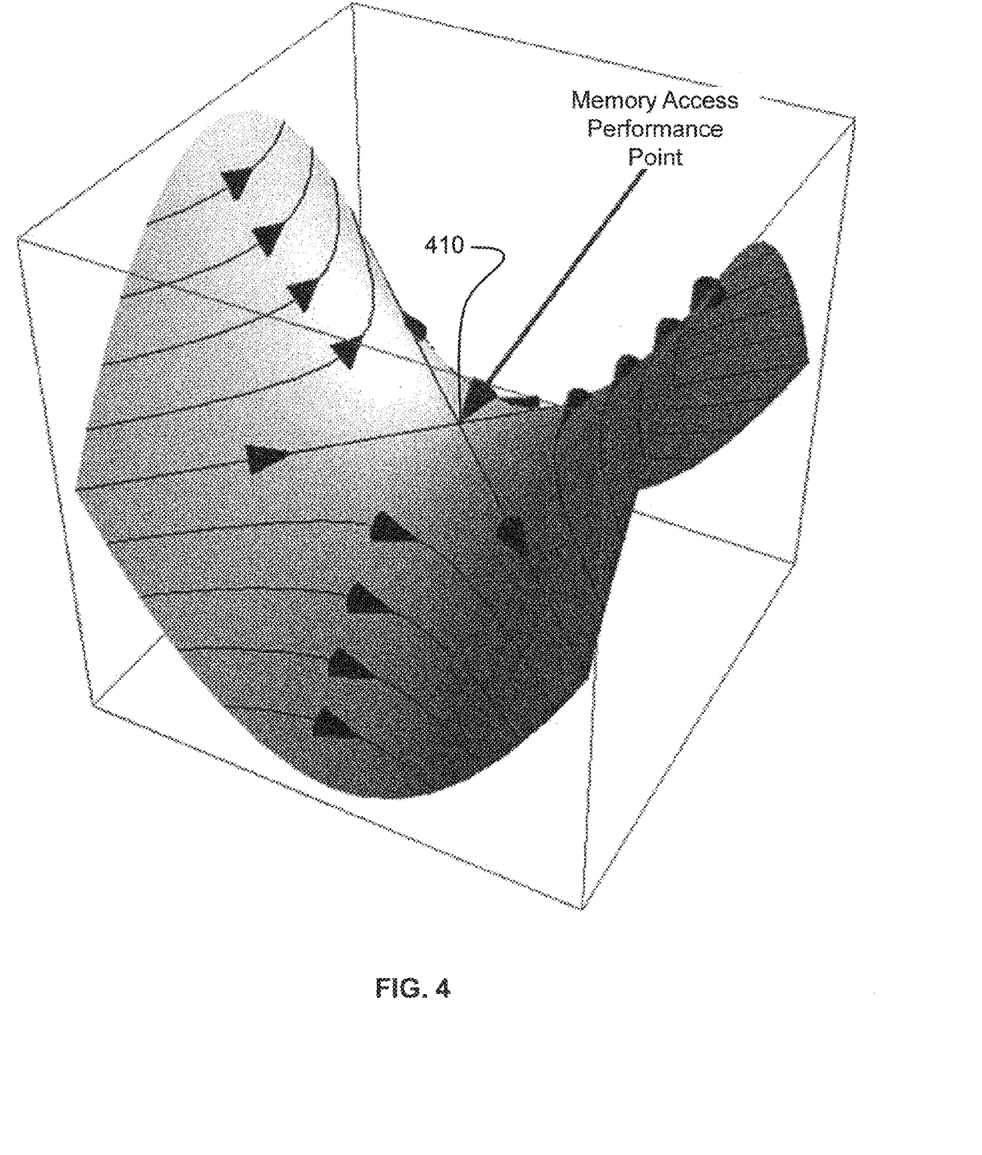
FIG. 4 illustrates the concept of calibration or tuning, performed by the system of FIG. 1, to maintain a determined memory access performance.

FIG. 4 illustrates the concept of calibration or tuning, performed by the system 100 of FIG. 1, to maintain a determined memory access performance. Initially, at system start-up, calibration is performed by the performance monitor logic 145 to calibrate or tune the PHY 150 to achieve a determined memory access performance (e.g., a bit error rate of $10^{-8}$). However, as time passes during normal operation of the system 100, the determined memory access performance can degrade. The degradation in the memory access performance may be due to the timing of the various high-speed signal lines and associated signals 210 drifting over time due to, for example, environmental changes such as power, voltage, and temperature associated with the system 100.

During real time system operation of the system 100, the performance monitor logic 145 acts to dynamically tune the PHY 150 in real time to maintain the determined memory access performance without disturbing normal data traffic. This dynamic tuning can be described in terms of multi-dimensional saddle point optimization. Referring to FIG. 4, the performance monitor logic 145 performs closed loop control to maintain the determined memory access performance at the saddle point 410. During the closed loop control, bit error information is fed back to the performance monitor logic 145 through the PHY 150 (see FIG. 3).

The performance monitor logic 140 uses the bit error information to calculate an instantaneous performance metric (e.g., an instantaneous bit error rate). In one embodiment, the instantaneous performance metric is used by the performance monitor logic 140 to run calibration routines. Each arrow in the diagram of FIG. 4 represents a calibration routine that is run to reach the saddle point 410 (i.e., the determined memory access performance).

The running of the calibration routines by the performance monitor logic 145 determines how the timing elements 220 of the PHY 150 are to be tuned to adjust the time delays and timing window positions of the high-speed signal lines and associated signals 210 in order to maintain the determined memory access performance. In this way, the DDR memory 110, the performance monitor logic 145, and the PHY 150 form a closed loop of continuous memory access performance control.

Without such dynamic real-time closed loop control, the process of writing data to and reading data from the memory (i.e., the memory access process) may have to be stopped and the memory may have to be flushed to eliminate the corrupted data. System level calibration has to be performed before resuming normal operation. Such interruptions in normal operation are inefficient and result in the reduction of system bandwidth and performance.

Figure 5:
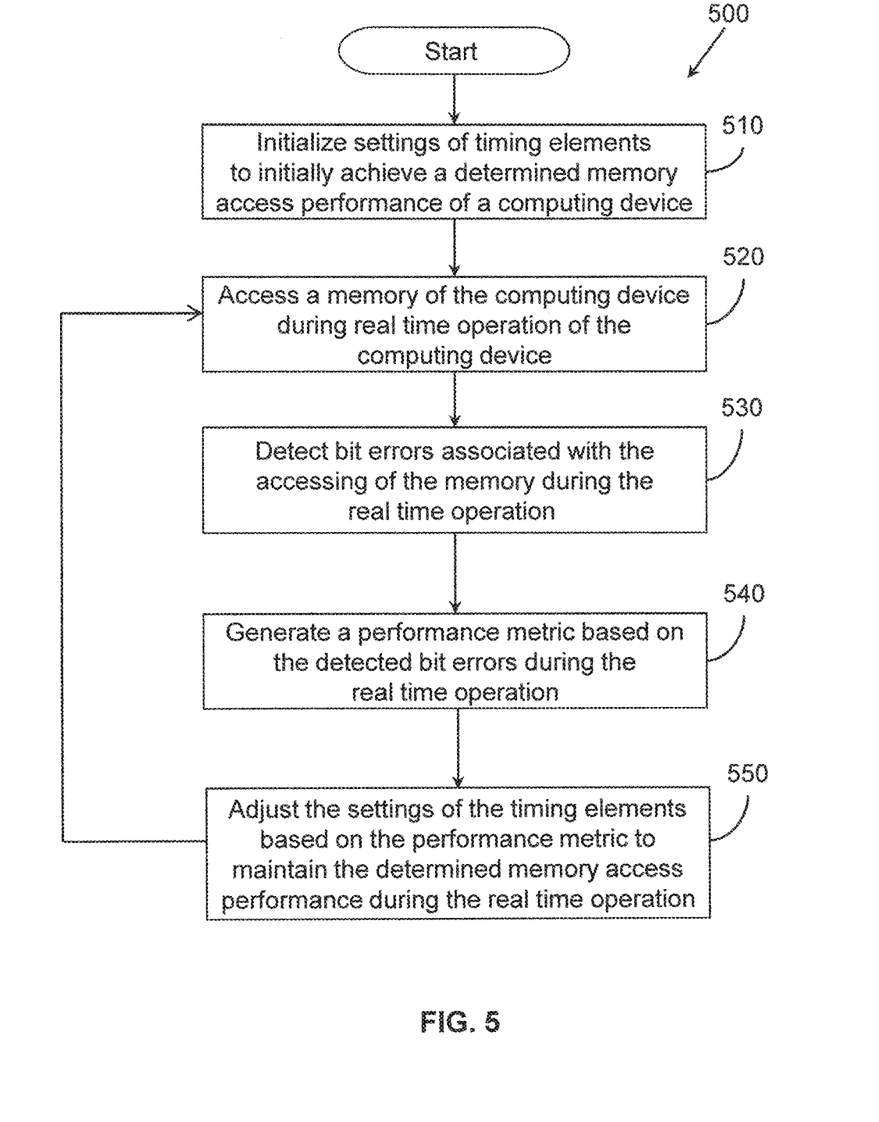
FIG. 5 illustrates one example embodiment of a method for performing closed loop control to maintain a determined memory access performance of the system of FIG. 1.

FIG. 5 illustrates one example embodiment of a method 500 for performing closed loop control to maintain a determined memory access performance of the system 100. Method 500 is implemented to be performed by the system 100 of FIG. 1, or by a computing device (e.g., an integrated circuit device) configured with an algorithm of method 500. Method 500 will be described from the perspective that the performance monitor logic 145 is part of the memory control logic 140, the ECC functionality is part of the performance monitor logic 145, and the timing elements 220 of the PHY 150 are adjusted by the performance monitor logic 145 in a closed loop manner.

Upon initiating method 500, at block 510, the system 100 initializes settings of a plurality of timing elements 220 of the PHY 150 to initially achieve a determined memory access performance. Initialization of the timing elements 220 causes the timing of the high-speed signal lines and associated signals 210 out of the PHY 150 to the DDR memory 110 to be properly tuned to achieve the determined memory access performance. In one embodiment, the memory control logic 140 searches through all of the potential timing delay windows to find the optimal delay.

At block 520, normal operation begins where the DDR memory 110 is accessed during real time operation of the system 100. During real time operation, data is being written to and read from the DDR memory 110 in response to the high-speed signal lines and associated signals 210 under the control of the memory control logic 140 as directed by the DMA logic 135, without disturbing normal data traffic. At block 530, bit errors associated with accessing the DDR memory 110 are detected during the real time operation. In one embodiment, the performance monitor logic 145 employs ECC techniques to detect the bit errors.

At block 540, the performance monitor logic 145 generates a performance metric based on the detected bit errors during the real time operation. In one embodiment, the performance metric is an instantaneous bit error rate (BER) associated with memory access performance. At block 550, settings of the timing elements of the PHY 150 are adjusted or tuned by the performance monitor logic 145 (e.g., via calibration routines implemented by the performance monitor logic 145) based on the performance metric during the real time operation, without disturbing normal data traffic. The adjustments of the timing elements 220 made in block 550 drive the memory access performance to the saddle point 410 (see FIG. 4). The method repeats between block 520 and block 550, forming continuous closed loop control to maintain the determined memory access performance at the saddle point 410. In this manner, continuous closed loop control to maintain a determined memory access performance is achieved.

Figure 6:
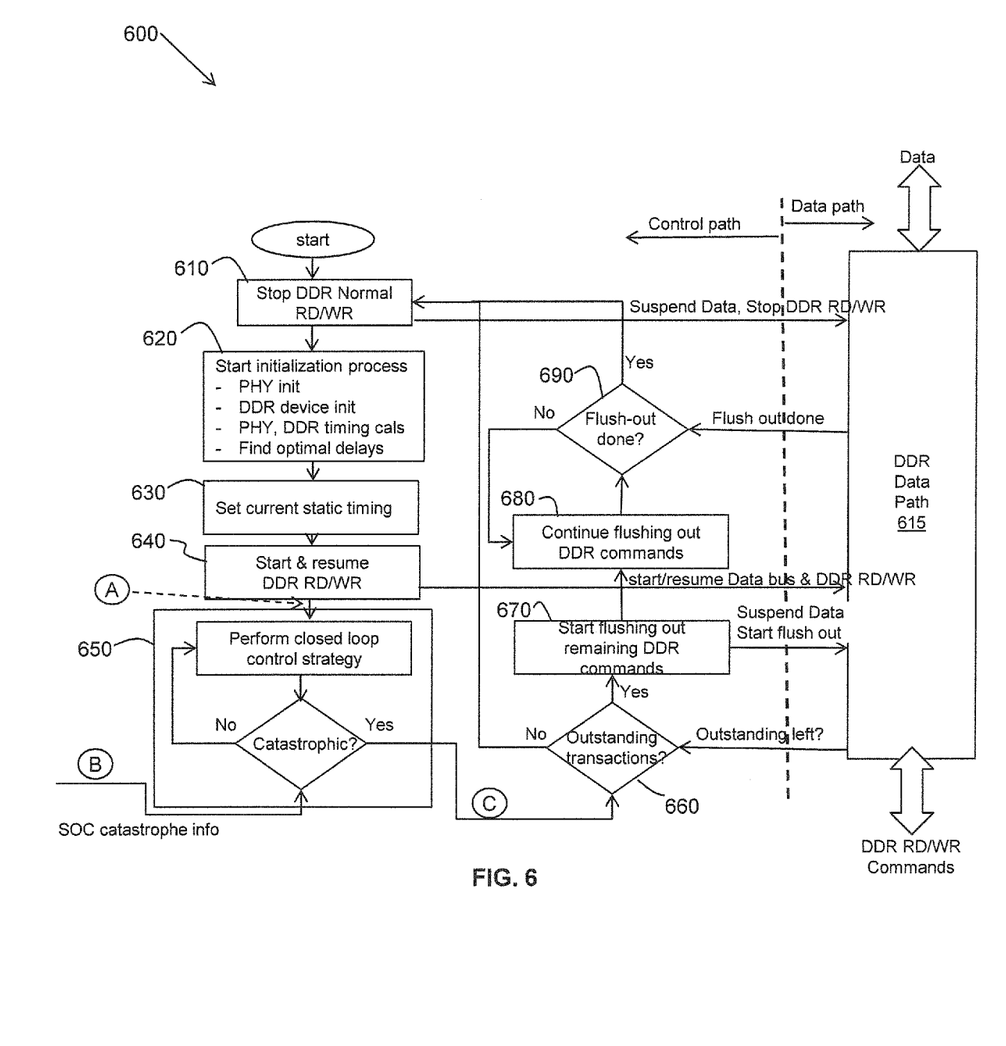
FIG. 6 illustrates another example embodiment of a method for performing closed loop control to maintain a determined memory access performance of the system of FIG. 1.

FIG. 6 illustrates another example embodiment of a method 600, for performing closed loop control to maintain a determined memory access performance of the system 100. Method 600 is implemented to be performed by the system 100 of FIG. 1, or by a computing device (e.g., an integrated circuit device) configured with an algorithm of method 600. Method 600 will be described from the perspective that the performance monitor logic 145 is part of the memory control logic 140, the ECC functionality is part of the performance monitor logic 145, and the timing elements 220 of the PHY 150 are adjusted by the performance monitor logic 145 in a closed loop manner.

Upon initiating method 600, at block 610, normal writing to and reading from DDR memory is stopped or suspended. That is, read/write (R/W) transactions through the DDR data path 615, for writing to and reading from the DDR memory 110, are terminated. In one embodiment, the DDR data path 615 flows from the DMA logic 130, through the memory control logic 140 and PHY 150, and to the DDR memory 110, and vice versa.

At block 620, initialization of the system is started. For example, initialization of the various components of the system 100 such as the memory control logic 140 and the PHY 150 is started. Initialization of the PHY 150 may include running calibration routines to determine initial optimal time delays and timing window positions associated with the initial timing of the high-speed signal lines and associated signals 210. The calibration routines may include, for example, a digital lock loop calibration routine, command and address training routines, data calibration and data strobe gating calibration routines, and clock training routines. Furthermore, in one embodiment, data within the DDR memory 110 may be initialized (e.g., to all "0"s" are all "1"s").

At block 630, the timing elements 220 of the PHY 150 are set in accordance with the initial timing of the initial optimal time delays and timing window positions determined in block 620. The initial timing may be referred to as static timing to reflect the fact that the initial timing does not change if real time closed loop control is not implemented, or until a catastrophic situation occurs that results in having to going back to block 620 to re-initialize.

At block 640, once initialization is complete, writing to and reading of data to the DDR memory 110 (i.e., memory access) is resumed, providing normal real time operation of the system 100. At block 650, a closed loop control process is performed to maintain the memory access performance of the system 100 at a determined level (e.g., a bit error rate of $10^{-9}$) without disrupting normal data traffic to/from the DDR memory 110. In one embodiment, the system 100 is configured to attempt to keep the method 600 at block 650 as long as possible, maintaining acceptable performance during normal operation.

Also at block 650, catastrophic report information is received which may indicate that a system level catastrophic failure has occurred with respect to memory access. When such a catastrophic failure does occur, method 600 leaves the closed loop control block 650 and proceeds to a catastrophe-handling part of the method 600 starting at block 660. In one embodiment, for a certain period of data flow, a threshold (e.g., a bit error rate threshold) may be set to trigger when a catastrophic failure occurs.

At block 660, a determination is made as to whether or not there are any outstanding read/write (R/W) transactions within the DDR data path 615. When there are no outstanding R/W transactions within the DDR data path 615, method 600 reverts to block 610 where writing to and reading from the DDR memory 110 is stopped or suspended. When there are outstanding R/W transactions within the DDR data path 615, the method proceeds to block 670 where the system starts flushing out the remaining DDR commands associated with the outstanding R/W transactions from the DDR data path 615.

At block 680, the system continues to flush out the remaining DDR commands associated with the outstanding R/W transactions from the DDR data path 615. At block 690 a determination is made as to whether or not the flushing out is completed. If the flushing out is not completed, the method continues to loop between block 680 and 690. When the flushing out is completed, the method reverts to block 610 where writing to and reading from the DDR memory 110 is stopped or suspended. Re-initialization of the system 100 is subsequently performed before attempting to resume normal operation.

In accordance with one embodiment, the closed loop control block 650 is configured to keep the system running normally with respect to memory access performance, minimizing occurrences of going through the catastrophe-handling part of the method 600 (blocks 660-690). By minimizing occurrences of going through the catastrophe-handling part of the method 600, system bandwidth and performance can be maintained at a high level, resulting in efficient operation of the system.

Figure 7:
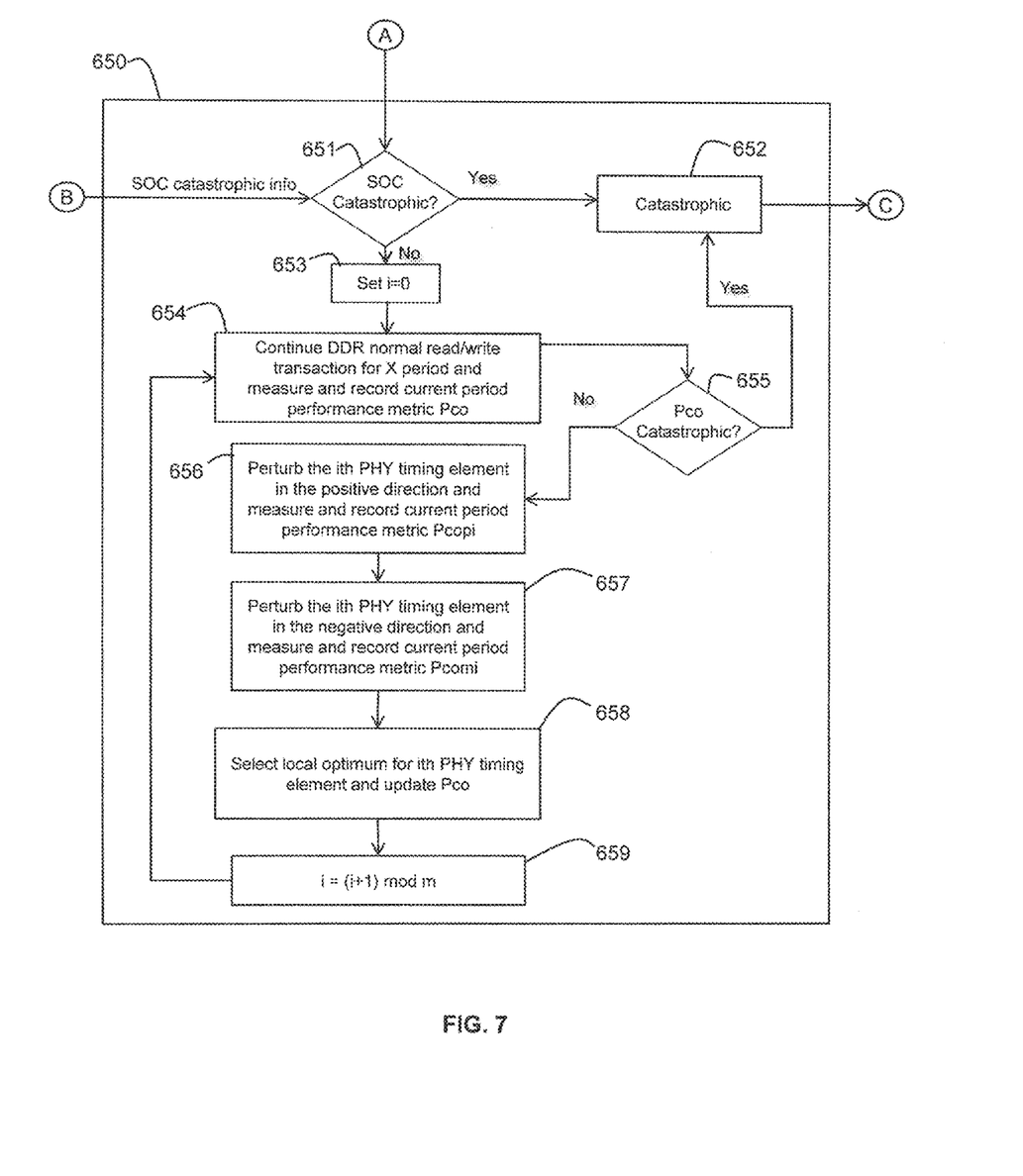
FIG. 7 illustrates one example embodiment of a control loop control process performed by of the method of FIG. 6.

FIG. 7 illustrates one example embodiment of the control loop control process performed at block 650 of the method 600. Block 650 will be discussed herein in terms of its constituent sub-blocks 651-659. As discussed previously herein, at block 650, catastrophic report information is received which may indicate that a system level catastrophic failure has occurred with respect to memory access. At sub-block 651 within block 650, a determination is made as to whether or not such a system level catastrophic failure has occurred. When such a catastrophic failure occurs, method 600 leaves the closed loop control block 650 through sub-block 652 and proceeds to the catastrophe-handling part of the method 600 starting at block 660.

When it is determined at sub-block 651 that a system level catastrophic failure has not occurred, the method remains in closed loop control block 650 and proceeds to sub-block 653. At sub-block 653, an index i is set to a value of zero (0). The index i is representative of a timing element 220 of a set of m timing elements of the PHY 150, where i and m are integer values. For example, in one embodiment, m may be a fixed value of ten (10) and i may be incremented between integer values of zero (0) and ten (10), such that each PHY timing element 220 is considered in turn.

At block 654, normal DDR read/write (R/W) transactions continue to be performed over a current time period X. For the current time period X, an initial current period performance metric Pco is determined based on bit error information associated with DDR memory access and the previously initialized settings of the PHY timing elements 220. At sub-block 655, a determination is made as to whether or not the current performance period metric Pco indicates a catastrophic failure with respect to DDR memory access.

For example, in one embodiment, the Pco is an instantaneous bit error rate (BER) that is compared to a threshold value at sub-block 655. When the instantaneous BER rises above the threshold value, a catastrophic failure is declared for the current time period X. When a catastrophic failure is declared for the current time period X, method 600 leaves the closed loop control block 650 through sub-block 652 and proceeds to the catastrophe-handling part of the method 600 starting at block 660.

When a catastrophic failure has not occurred as determined at sub-block 655, the method remains within closed loop control block 650 and proceeds to sub-block 656. At sub-block 656, the $i^{th}$ PHY timing element 220 is perturbed in a positive direction and a resultant current period performance metric for the $i^{th}$ PHY timing element Pcopi is determined. Pcopi is determined based on bit error information associated with DDR memory access as part of considering the positively perturbed $i^{th}$ PHY timing element 220 during the current time period X. Similarly, at sub-block 657, the $i^{th}$ PHY timing element 220 is perturbed in a negative direction and a resultant current period performance metric for the $i^{th}$ PHY timing element Pcomi is determined. Pcomi is determined based on bit error information associated with DDR memory access as part of considering the negatively perturbed $i^{th}$ PHY timing element 220 during the current time period X.

At sub-block 658, a local optimum of the ith PHY timing element is selected and the current performance period metric Pco is updated accordingly. For example, if (Pco>=Pcopi) AND (Pco>=Pcomi), then set Pco=Pco and set the $i^{th}$ timing element to the original setting before perturbation. If (Pcopi>=Pco) AND (Pcopi>=Pcomi), then set Pco=Pcopi and set the $i^{th}$ timing element to the positively perturbed level. If (Pcomi>=Pco) AND (Pcomi>=Pcopi), then set Pco=Pcomi and set the $i^{th}$ timing element to the negatively perturbed level. In this manner, the $i^{th}$ PHY timing element is adjusted (positively or negatively), if warranted, to maintain memory access performance at the determined saddle point 410 (see FIG. 4).

At sub-block 659, the index i is incremented by a value of one (1) and the method reverts to sub-block 654 to consider the next PHY timing element. The closed loop control process between sub-blocks 654 and 659 continues in order to consider all of the PHY timing elements 220 for the current time period X, or until a catastrophic failure is determined at sub-block 655. The process further continues for subsequent time periods X. In this manner, any or all of the PHY timing elements 220 may be adjusted during real time operation of the system 100, without disturbing normal data traffic to/from the DDR memory 110.

By providing closed loop control at the level of the high-speed signal lines and associated signals 210 as disclosed herein, memory access performance can be established and maintained at a determined level without having to interrupt normal real time operation of the system 100 as frequently as when closed loop control is not provided. As a result, system bandwidth and performance may be maintained for longer periods of time before having to re-initialize the system.

Computing Device Embodiment

Figure 8:
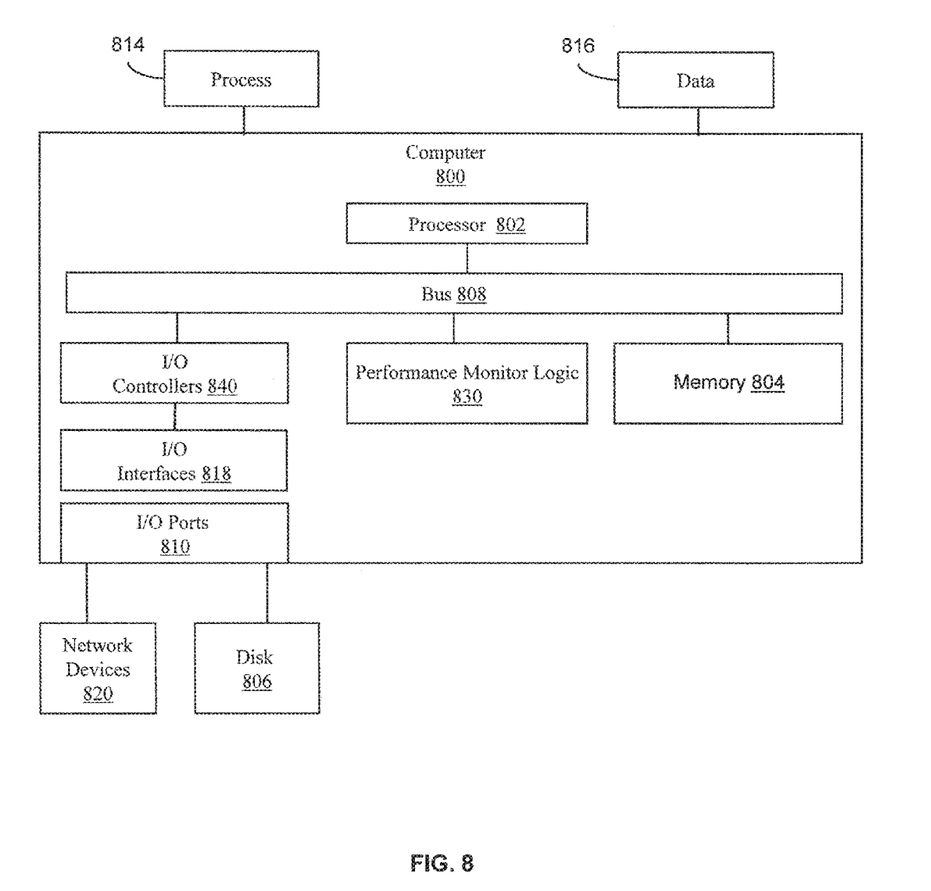
FIG. 8 illustrates one example embodiment of a computing device upon which an embodiment of a performance monitoring tool may be implemented.

FIG. 8 illustrates an example computing device that is configured and/or programmed with one or more of the example systems and methods described herein, and/or equivalents. The example computing device may be a computer 800 that includes a processor 802, a memory 804, and input/output ports 810 operably connected by a bus 808. In one example, the computer 800 may include performance monitor logic 830 configured to facilitate continuous closed loop control to maintain a determined memory access performance, similar to performance monitor logic 145 shown in FIG. 1, FIG. 2, and FIG. 3. In different examples, the logic 830 may be implemented in hardware, a non-transitory computer-readable medium with stored instructions, firmware, and/or combinations thereof. While the logic 830 is illustrated as a hardware component attached to the bus 808, it is to be appreciated that in one example, the logic 830 could be implemented in the processor 802.

In one embodiment, logic 830 or the computer is a means (e.g., structure: hardware, non-transitory computer-readable medium, firmware) for performing the actions described. In some embodiments, the computing device may be one or more integrated circuits. The means may be implemented, for example, as an ASIC programmed to perform continuous closed loop control to maintain a determined memory access performance. In other embodiments, the computing device may be a server operating in a cloud computing system, a server configured in a Software as a Service (SaaS) architecture, a smart phone, laptop, tablet computing device, and so on). The means may also be implemented as stored computer executable instructions that are presented to computer 800 as data 816 that are temporarily stored in memory 804 and then executed by processor 802.

Logic 830 may also provide means (e.g., hardware, non-transitory computer-readable medium that stores executable instructions, firmware) for performing continuous closed loop control to maintain a determined memory access performance.

Generally describing an example configuration of the computer 800, the processor 802 may be a variety of various processors including dual microprocessor and other multi-processor architectures. A memory 804 may include volatile memory and/or non-volatile memory. Non-volatile memory may include, for example, ROM, PROM, and so on. Volatile memory may include, for example, RAM, SRAM, DRAM, and so on.

A storage disk 806 may be operably connected to the computer 800 via, for example, an input/output interface (e.g., card, device) 818 and an input/output port 810. The disk 806 may be, for example, a magnetic disk drive, a solid state disk drive, a floppy disk drive, a tape drive, a Zip drive, a flash memory card, a memory stick, and so on. Furthermore, the disk 806 may be a CD-ROM drive, a CD-R drive, a CD-RW drive, a DVD ROM, and so on. The memory 804 can store a process 814 and/or a data 816, for example. The disk 806 and/or the memory 804 can store an operating system that controls and allocates resources of the computer 800.

The computer 800 may interact with input/output devices via the i/o interfaces 818 and the input/output ports 810. Input/output devices may be, for example, a keyboard, a microphone, a pointing and selection device, cameras, video cards, displays, the disk 806, the network devices 820, and so on. The input/output ports 810 may include, for example, serial ports, parallel ports, and USB ports.

The computer 800 can operate in a network environment and thus may be connected to the network devices 820 via the i/o interfaces 818, and/or the i/o ports 810. Through the network devices 820, the computer 800 may interact with a network. Through the network, the computer 800 may be logically connected to remote computers. Networks with which the computer 800 may interact include, but are not limited to, a LAN, a WAN, and other networks.

Integrated Circuit Device Embodiment

Figure 9:
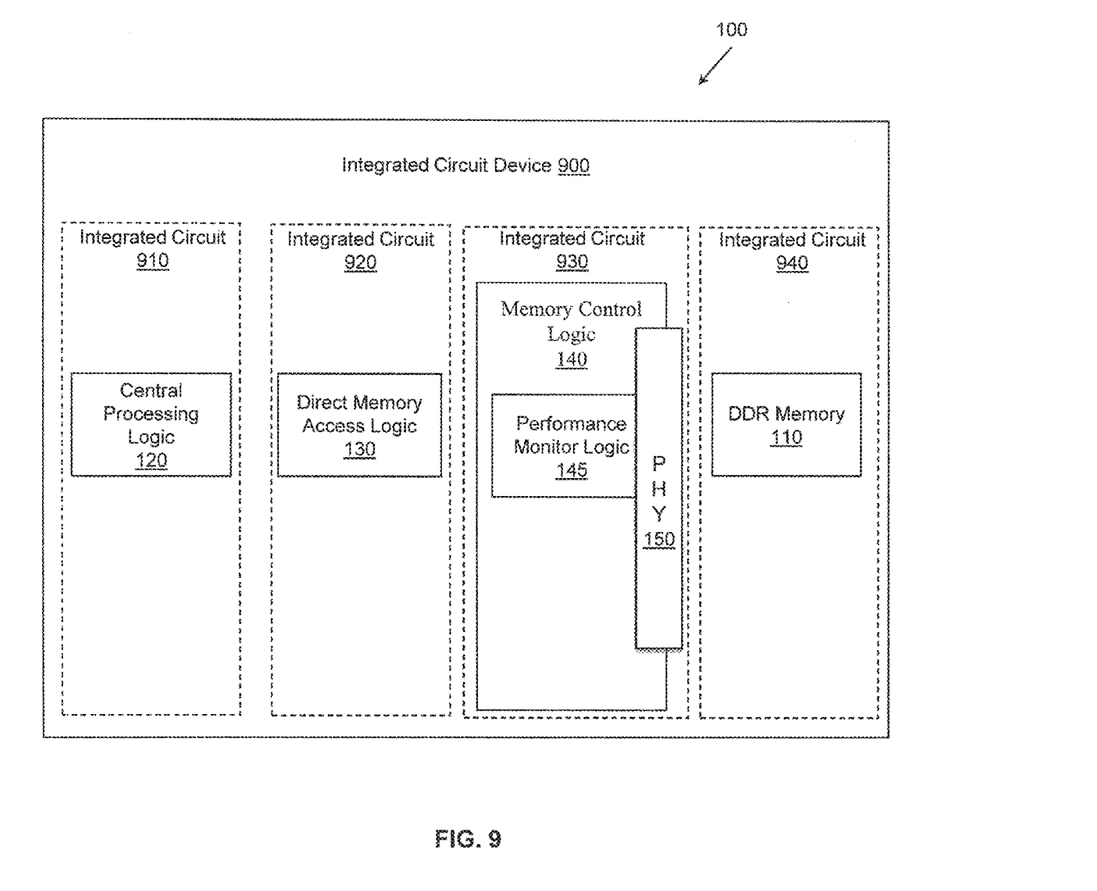
FIG. 9 illustrates one embodiment of the system of FIG. 1 implemented as an integrated circuit device and providing continuous closed loop control to maintain a determined memory access performance.

In one embodiment, the computing device may be the system 100 on one or more integrated circuit chips. FIG. 9 illustrates one embodiment of the system 100 of FIG. 1 implemented as an integrated circuit device 900 and providing continuous closed loop control to maintain a determined memory access performance. In this embodiment, the central processing logic 120 is embodied as a separate integrated circuit 910. Additionally, the direct memory access logic 130 is embodied on an individual integrated circuit 920. The memory control logic 140, which includes the performance monitor logic 145 and the PHY 150, is also embodied on an individual integrated circuit 930. Furthermore, the DDR memory 110 is embodied on an individual integrated circuit 940.

The circuits are connected via connection paths to communicate signals. While integrated circuits 910, 920, 930, and 940 are illustrated as separate integrated circuits, they may be integrated into a common integrated circuit device 900. Additionally, integrated circuits 910, 920, 930, and 940 may be combined into fewer integrated circuits or divided into more integrated circuits than illustrated.

In another embodiment, the central processing logic 120, the direct memory access logic 130, the performance monitor logic 145, and the DDR memory 110 (which are illustrated in integrated circuits 910, 920, 930, and 940, respectively) may be combined into a separate application-specific integrated circuit. In other embodiments, portions of the functionality associated with the central processing logic 120, the direct memory access logic 130, the performance monitor logic 145, and the DDR memory 110 may be embodied as firmware executable by a processor and stored in a non-transitory memory (e.g., a non-transitory computer storage medium).

DEFINITIONS AND OTHER EMBODIMENTS

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium" or "computer storage medium", as used herein, refers to a non-transitory medium that stores instructions and/or data configured to perform one or more of the disclosed functions when executed. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an application specific integrated circuit (ASIC), a programmable logic device, a compact disk (CD), other optical medium, a random access memory (RAM), a read only memory (ROM), a memory chip or card, a memory stick, solid state storage device (SSD), flash drive, and other media from which a computer, a processor or other electronic device can function with. Each type of media, if selected for implementation in one embodiment, may include stored instructions of an algorithm configured to perform one or more of the disclosed and/or claimed functions. Computer-readable media described herein are limited to statutory subject matter under 35 U.S.C §101.

"Logic", as used herein, represents a component that is implemented with computer or electrical hardware, firmware, a non-transitory medium with stored instructions of an executable application or program module, and/or combinations of these to perform any of the functions or actions as disclosed herein, and/or to cause a function or action from another logic, method, and/or system to be performed as disclosed herein. Logic may include a microprocessor programmed with an algorithm, a discrete logic (e.g., ASIC), at least one circuit, an analog circuit, a digital circuit, a programmed logic device, a memory device containing instructions of an algorithm, and so on, any of which are configured to perform one or more of the disclosed functions. In one embodiment, logic may include one or more gates, combinations of gates, or other circuit components configured to perform one or more of the disclosed functions. Where multiple logics are described, it may be possible to incorporate the multiple logics into one logic. Similarly, where a single logic is described, it may be possible to distribute that single logic between multiple logics. In one embodiment, one or more of these logics are corresponding structure associated with performing the disclosed and/or claimed functions. Choice of which type of logic to implement may be based on desired system conditions or specifications. Logic is limited to statutory subject matter under 35 U.S.C. §101.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, non-transitory computer-readable medium). Logical and/or physical communication channels can be used to create an operable connection.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional actions that are not illustrated in blocks. The methods described herein are limited to statutory subject matter under 35 U.S.C §101.

To the extent that the term "includes" or "including" is employed in the detailed description or the claims, it is intended to be inclusive in a manner similar to the term "comprising" as that term is interpreted when employed as a transitional word in a claim.

While the disclosed embodiments have been illustrated and described in considerable detail, it is not the intention to restrict or in any way limit the scope of the appended claims to such detail. It is, of course, not possible to describe every conceivable combination of components or methodologies for purposes of describing the various aspects of the subject matter. Therefore, the disclosure is not limited to the specific details or the illustrative examples shown and described. Thus, this disclosure is intended to embrace alterations, modifications, and variations that fall within the scope of the appended claims, which satisfy the statutory subject matter requirements of 35 U.S.C. §101.

What is claimed is:

1. An apparatus comprising:
   memory configured to be accessed by having data written thereto and read therefrom;
   memory control logic configured to control memory access of the memory via a plurality of signal lines;
   physical layer logic configured to provide a tunable signal interface for the plurality of signal lines between the memory control logic and the memory; and
   performance monitor logic configured to provide closed loop control, to maintain a determined apparatus performance associated with the memory access, by:
   (i) detecting bit errors associated with the memory access during real time operation of the apparatus,
   (ii) generating a performance metric based on, at least in part, the detected bit errors during the real time operation of the apparatus, and
   (iii) tuning a signal parameter of at least one signal associated with at least one signal line of the plurality of signal lines via the physical layer logic based on, at least in part, the performance metric during the real time operation of the apparatus.

2. The apparatus of claim 1, wherein the memory comprises a double data rate memory.

3. The apparatus of claim 1, wherein the performance monitor logic is configured to correct the detected bit errors via error control coding techniques during the real time operation of the apparatus.

4. The apparatus of claim 1, wherein the plurality of signal lines comprise clock signal lines, address signal lines, command signal lines, and control signal lines.

5. The apparatus of claim 1, wherein the signal parameter comprises at least one of a time delay and a timing window position.

6. The apparatus of claim 1, wherein the plurality of signal lines are configured to communicate analog signals, and wherein a frequency of at least one of the analog signals is greater than or equal to 800 MHz.

7. The apparatus of claim 1, wherein the plurality of signal lines are configured to communicate analog signals, and wherein a frequency of at least one of the analog signals is greater than or equal to 1600 MHz.

8. The apparatus of claim 1, wherein a portion of the memory is configured based on error control coding techniques performed by the performance monitor logic.

9. The apparatus of claim 1, wherein the determined apparatus performance is a bit error rate associated with the memory access of the memory.

10. The apparatus of claim 1, wherein the apparatus is a system-on-chip device further comprising:
    central processing logic, operably connected to the memory control logic, configured to provide commands to the memory control logic via a first communication bus; and
    direct memory access logic, operably connected to the memory control logic and the central processing logic, configured to access the memory via a second communication bus.

11. A computer-implemented method performed by a computing device where the computing device includes at least a processor for executing instructions from a memory, the method comprising:
    accessing a memory of the computing device during real time operation of the computing device via at least the processor;
    detecting bit errors associated with the accessing of the memory during the real time operation of the computing device via at least the processor;
    generating a performance metric based on, at least in part, the detected bit errors during the real time operation of the computing device via at least the processor; and
    adjusting a setting of at least one timing element, of a plurality of timing elements of a physical layer of the computing device, based on the performance metric during the real time operation of the computing device, via at least the processor, to maintain a determined memory access performance.

12. The computer-implemented method of claim 11, further comprising initializing settings of the plurality of timing elements, via at least the processor, to initially achieve the determined memory access performance.

13. The computer-implemented method of claim 11, wherein the determined memory access performance is a bit error rate.

14. The computer-implemented method of claim 11, further comprising correcting the detected bit errors via error control coding techniques during the real time operation of the computing device via at least the processor.

15. The computer-implemented method of claim 11, wherein at least a portion of the accessing of the memory during the real time operation of the computing device is based on error control coding techniques.

16. An integrated circuit device, comprising:
central processing logic;
direct memory access logic operably connected to the central processing logic;
double data rate memory; and
memory control logic, operably connected to the central processing logic and the direct memory access logic, configured to provide continuous real time closed loop control to maintain a determined memory access performance of the double data rate memory during real time operation of the integrated circuit device,
wherein the central processing logic, the direct memory access logic, and the memory control logic are configured as at least one integrated circuit on a chip.

17. The integrated circuit device of claim 16, further comprising a physical layer logic configured to provide a plurality of signal lines to the double data rate memory for controlling memory access of the double data rate memory under the control of the memory control logic, wherein the physical layer logic is configured as an integrated circuit on a chip.

18. The integrated circuit device of claim 17, wherein the physical layer logic comprises a plurality of tapped delay lines and registers, associated with the plurality of signal lines, configured to be adjusted under the control of the memory control logic to tune time delays and timing window positions associated with analog signals associated with the plurality of signal lines as part of the closed loop control.

19. The integrated circuit device of claim 16, further comprising error control coding logic configured to correct bit errors associated with accessing the double data rate memory, wherein the error control coding logic is configured as an integrated circuit on a chip.

20. The integrated circuit device of claim 18, wherein at least one frequency of at least one signal of the analog signals is greater than or equal to 800 Mhz.

* * * * *